United States Patent [19] [11] Patent Number: 5,071,794
Shaikh [45] Date of Patent: Dec. 10, 1991

| | | |
|---|---|---|
| [54] | POROUS DIELECTRIC COMPOSITIONS | |
| [75] | Inventor: | Aziz S. Shaikh, Ventura, Calif. |
| [73] | Assignee: | Ferro Corporation, Cleveland, Ohio |
| [21] | Appl. No.: | 641,811 |
| [22] | Filed: | Jan. 16, 1991 |

Related U.S. Application Data

[63] Continuation of Ser. No. 389,778, Aug. 4, 1989, abandoned.

[51] Int. Cl.$^5$ ............................................. C04B 35/14
[52] U.S. Cl. ...................................... 501/17; 501/16; 501/11
[58] Field of Search ...................... 501/11, 16, 17, 20, 501/39

[56] References Cited

U.S. PATENT DOCUMENTS

| | | | |
|---|---|---|---|
| 3,816,172 | 6/1974 | Hoffman | 111/212 |
| 4,084,975 | 4/1978 | Faust | 106/48 |
| 4,084,976 | 4/1978 | Hinton | 106/48 |
| 4,301,324 | 11/1981 | Kumar et al. | 174/68.5 |
| 4,323,652 | 4/1982 | Baudry et al. | 501/17 |
| 4,413,061 | 11/1983 | Kumar et al. | 501/7 |
| 4,435,511 | 3/1984 | Weaver | 501/22 |
| 4,443,550 | 4/1984 | Kume et al. | 501/65 |
| 4,532,221 | 6/1985 | Barlier et al. | 501/22 |
| 4,547,461 | 10/1985 | Barth et al. | 501/20 |
| 4,547,625 | 10/1985 | Tasaki et al. | 174/68.5 |
| 4,598,167 | 6/1986 | Ushifusa et al. | 174/68.5 |
| 4,621,066 | 11/1986 | Wishigaki et al. | 501/128 |
| 4,642,148 | 2/1987 | Kurihara et al. | 156/89 |
| 4,649,125 | 3/1987 | Takeuchi et al. | 501/15 |
| 4,654,095 | 3/1987 | Steinberg | 156/89 |
| 4,714,687 | 12/1987 | Holleran et al. | 501/9 |
| 4,749,665 | 6/1988 | Yarc et al. | 501/32 |
| 4,752,531 | 6/1988 | Steinberg | 428/426 |
| 4,816,615 | 2/1989 | Prabhu et al. | 174/68.5 |
| 4,830,988 | 5/1989 | Hang et al. | 501/21 |
| 4,849,379 | 7/1989 | McCormick | 501/20 |

FOREIGN PATENT DOCUMENTS

| | | |
|---|---|---|
| 0163155 | 4/1985 | European Pat. Off. . |
| 0209776 | 7/1986 | European Pat. Off. . |
| 0219807 | 10/1986 | European Pat. Off. . |
| 0232767 | 1/1987 | European Pat. Off. . |
| 0234338 | 2/1987 | European Pat. Off. . |
| 0253342 | 7/1987 | European Pat. Off. . |
| 0265340 | 10/1987 | European Pat. Off. . |
| 54-154079 | 5/1978 | Japan . |
| 471437 | 5/1969 | Switzerland . |
| 9000966 | 2/1990 | World Int. Prop. O. . |

OTHER PUBLICATIONS

Remex Electronic Materials—"Nitrogen Fireable Dielectrics".
Alcoa Product Data Chemicals—"Calcined, Reactive, Tabular Aluminas and Calcium Aluminate Cement", Apr. 30, 1976.
Electro Materials Corp. of America,—EMCA Bulletin No. 315, Dielectric System 1300.
"A Practical Sourcebook for Designers, Fabricators, and Users", Charles A. Harper.
"Du Pont Thick Film Dielectric Compositions", 1984.
University of South Florida—"Hybrid Microelectronics" Short Course Notes—p. 77.

Primary Examiner—Mark L. Bell
Assistant Examiner—Alan Wright
Attorney, Agent, or Firm—Renner, Otto, Boisselle & Sklar

[57] ABSTRACT

This invention provides for a porous dielectric composition comprising at least one crystallized glass, at least one non-crystallized glass, and at least one Group IIA metal silicate, the porosity of said composition ranging from about 2% to about 50% by volume open space, the average diameter of the pore spaces in said composition ranging from about 1 to about 30 micrometers. The invention also provides for dielectric pastes and dieletric tapes for providing these dielectric compositions. The invention also provides for a process for making these dielectric compositions. These dielectric compositions are useful in making multilayered circuits, thick film circuits and other electronic components.

37 Claims, 2 Drawing Sheets

POROUS DIELECTRIC COMPOSITIONS

This is a continuation of copending application Ser. No. 07/389,778 filed on Aug. 4, 1989, now abandoned.

TECHNICAL FIELD

This invention relates to porous dielectric compositions, and to multilayered circuits, thick film circuits and other electronic components using these compositions. The invention also relates to dielectric pastes and dielectric tapes for providing such porous dielectric compositions, and to a method of making such porous dielectric compositions.

BACKGROUND OF THE INVENTION

Multilayer thick film circuits have been used for many years to increase circuit functionality per unit of area. The dielectrics used in these circuits are comprised of finely divided particles of dielectric solids, dispersed in an inert organic medium, the dielectric solids being inorganic oxides or glasses. Recent advances in circuit technology include the requirements of higher circuit densities and higher propagation speeds. Dielectric materials having low dielectric constants that are stable at high temperatures and high humidities and that have good mechanical properties are required for such uses.

Vacuum has the lowest dielectric constant, which is 1.0. Polymeric dielectric materials typically have dielectric constants in the range of about 2.6 to about 3.8. Some of the problems associated with these polymeric materials include their inability to withstand high temperatures, their degradation under extended exposure to temperatures in excess of about 200° C., poor thermal conductivity and poor resistance to humidity. Glass-ceramic materials are more stable than polymeric materials at high temperature and in humid atmosphere, and have better mechanical properties for most dielectric applications than such polymeric materials. However, glass-ceramic materials have higher dielectric constants than polymeric materials, typically in the range of about 7-12, and have thus far not been found to be acceptable for use as dielectrics in thick film circuits and the like.

SUMMARY OF THE INVENTION

This invention provides for a porous dielectric composition comprising at least one crystallized glass, at least one non-crystallized glass, and at least one Group IIA metal silicate, the porosity of said composition ranging from about 2% to about 50% by volume open space, the average diameter of the pore spaces in said composition ranging from about 1 to about 30 micrometers. The invention also provides for dielectric pastes and dielectric tapes for providing these dielectric compositions. The invention also provides for a process for making these dielectric compositions. These dielectric compositions are useful in making multilayered circuits, thick film circuits and other electronic components.

DESCRIPTION OF THE PREFERRED EMBODIMENTS

Figure 1:
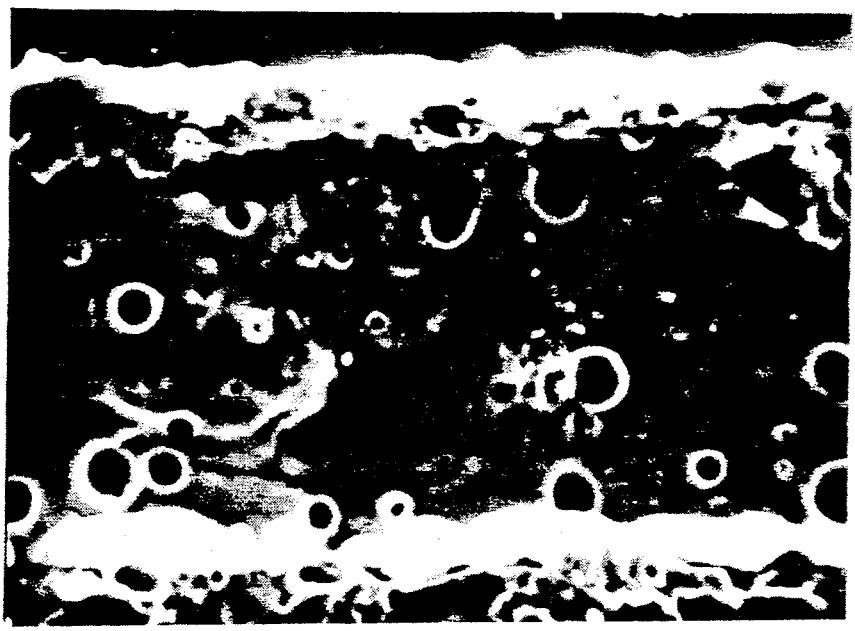
FIG. 1 is a photomicrograph of a cross-section of the composite structure made in accordance with Example 1 using a scanning electron microscope, the voltage being 15 KV and the magnification factor being 980X. The bright dense layers at the top and bottom are gold conductor layers, and the dark porous portion between the conductor layers is the dielectric material.

The inventive dielectric compositions are comprised of at least one crystallized glass (A), at least one non-crystallized glass (B), and at least one Group IIA metal silicate.

Glass (A) preferably has a glass transition temperature (Tg) in the range of about 600° C. to about 650° C., more preferably about 610° C. to about, 630° C. The dilatometric softening point (DSP) is preferably in the range of about 620° C. to about 660° C., more preferably about 630° C. to about 650° C. The coefficient of thermal expansion (CTE) is preferably about 70 to about $114 \times 10^{-7}$/°C. between room temperature and 300° C. The density of glass (A) is preferably from about 2.4 to about 2.8 gms/cc, more preferably about 2.5 to about 2.7 gms/cc. Glass (A) has the following composition:

| | Percent by Wt. | | |
|---|---|---|---|
| | Preferred | More Preferred | More Preferred |
| SiO$_2$ | 15–40 | 20–30 | 23–27 |
| B$_2$O$_3$ | 11–30 | 15–25 | 18–22 |
| CaO | 42–64 | 50–60 | 53–57 |

Glass (B) preferably has a Tg in the range of about 450° C. to about 520° C., more preferably about 460° C. to about 500° C. The DSP is preferably in the range of about 550° C. to about 610° C., more preferably about 560° C. to about 600° C. The CTE is preferably about 28 to about $40 \times 10^{-7}$/°C. between room temperature and 300° C. The density of glass (B) is preferably from about 2 to about 2.4 gms/cc, more preferably about 2.1 to about 2.3 gms/-cc. Glass (B) has the following composition:

| | Percent by Wt. | | |
|---|---|---|---|
| | Preferred | More Preferred | More Preferred |
| SiO$_2$ | >60 | 60–80 | 65–75 |
| B$_2$O$_3$ | 10–35 | 20–30 | 22–28 |
| Na$_2$O | 0–6 | 0–3 | 0.1–1 |
| K$_2$O | 0–6 | 0–3 | 0.5–1.5 |
| Li$_2$O | 0–6 | 0–3 | 0.1–1 |

-continued

|  | Percent by Wt. | | |
| --- | --- | --- | --- |
|  | Preferred | More Preferred | More Preferred |
| $Al_2O_3$ | 0–10 | 0–4 | 0.5–2 |

In one embodiment of the invention, the Group IIA metal silicate is glass or ceramic (C). Glass or ceramic (C) preferably has a Tg in the range of about 590° C. to about 650° C., more preferably about 610° C. to about 630° C. The DSP is preferably in the range of about 650° C. to about 690° C., more preferably about 660° C. to about 680° C. The CTE is preferably about 50 to about $60 \times 10^{-7}$/°C. at room temperature to 300° C. The density of glass or ceramic (C) is preferably from about 2.9 to about 3.3 gms/cc, more preferably about 3.0 to about 3.2 gms/cc. Glass or ceramic (C) has the following composition:

|  | Percent by Wt. | | |
| --- | --- | --- | --- |
|  | Preferred | More Preferred | More Preferred |
| $SiO_2$ | 15–40 | 25–40 | 35–40 |
| $B_2O_3$ | 0–20 | 5–18 | 10–15 |
| BaO | 20–50 | 20–35 | 20–25 |
| $Al_2O_3$ | 0–35 | 0–15 | 5–10 |
| ZnO | 0–15 | 5–15 | 10–15 |
| $ZrO_2$ | 0–2 | 0.5–2 | 1–1.5 |
| $TiO_2$ | 0–2 | 0–1 | 0–0.5 |
| MgO | 0–6 | 2–6 | 4.5–5.5 |

In another embodiment of the invention, the Group IIA metal silicate is glass or ceramic (D). An example of glass or ceramic (D) is cordierite. Glass or ceramic (D) preferably has a Tg in the range of about 740° C. to about 820° C., more preferably about 750° C. to about 790° C. The DSP is preferably in the range of about 770° C. to about 950° C., more preferably about 820° C. to about 880° C. The CTE is preferably about 10 to about $40 \times 10^{-7}$/°C. at room temperature to 300° C. The density of glass or ceramic (D) is preferably from about 2.3 to about 2.9 gms/cc, more preferably about 2.4 to about 2.8 gms/cc. Glass or ceramic (D) has the following composition:

|  | Percent by Wt. | |
| --- | --- | --- |
|  | Preferred | More Preferred |
| $SiO_2$ | 48–55 | 50–53 |
| $Al_2O_3$ | 18–40 | 20–40 |
| MgO | 10–25 | 12–25 |
| ZnO | 0–2 | 0–1 |
| $Li_2O$ | 0–1 | 0–0.5 |
| $B_2O_3$ | 0–3 | 0–2 |
| $P_2O_5$ | 0–3 | 0–2 |
| $TiO_2$ | 0–3 | 0–2.5 |
| $SnO_2$ | 0–3 | 0–2.5 |
| $ZrO_2$ | 0–3 | 0–2.5 |

In still another embodiment of the invention, the Group IIA metal silicate is comprised of at least two Group IIA metal silicates, one having the composition of glass or ceramic (C) and the other having the composition of glass or ceramic (D). Thus, the inventive dielectric compositions can be comprised of glass or ceramics (A)+(B)+(C); (A)+(B)+(D); or (A)+(B)+(C)+(D).

Each of the above glass or ceramic compositions (A)–(D) can be prepared in any conventional manner. For example, a mixture of the appropriate ingredients can be placed in a platinum crucible and melted (e.g., 1450°–550° C.), the resulting glass composition is then poured onto cold steel rolls to form thin flakes suitable for milling. These flakes are then milled to a suitable particle size distribution (e.g., about 0.5 to about 20 micrometers).

The inventive dielectric compositions preferably contain from about 15% to about 80% by weight, more preferably about 20% to about 50% by weight of glass (A); about 15% to about 80% by weight, more preferably about 40% to about 70% by weight of glass (B); up to about 45% by weight, preferably about 5% to about 30% by weight of glass or ceramic (C); and up to about 40% by weight, preferably about 5% to about 25% by weight of glass or ceramic (D). While the presence of each of components (C) and (D) is optional, at least one of these components must be present in the inventive dielectric compositions; said component preferably being present at a concentration level of at least about 3% by weight, more preferably at least about 5% by weight, more preferably at least about 8% by weight. The total concentration of components (C) and (D) in the inventive dielectric compositions is preferably up to about 45% by weight, more preferably up to about 40% by weight, more preferably up to about 35% by weight, more preferably up to about 28% by weight. The inventive dielectric compositions can also contain up to about 5% by weight, more preferably up to about 3% by weight, more preferably up to about 1% by weight of (E), at least one crystallizing agent. An example of such a crystallizing agent is $CaB_2O_4$. The inventive dielectric compositions can also contain up to about 5% by weight, more preferably up to about 3% by weight, more preferably up to about 1% by weight of (F), at least one colorant. An example of such a colorant is $Cr_2O_3$.

Components (A)–(F) are milled together in the presence of an alcohol using conventional ball-milling techniques to provide a mixture of particulate solids having an average diameter in the range of about 2 to about 10 micrometers, more preferably about 3 to about 7 micrometers. The resulting product is a homogeneous mixture of solids and alcohol. The solids are dried, and then can be dispersed in a suitable vehicle or binder to provide a dielectric paste or dielectric tape.

The alcohol used in milling the components (A)–(F) is preferalby a monohydric, saturated or unsaturated aliphatic alcohol of about 1 to about 6 carbon atoms, more preferably about 2 to about 5 carbon atoms. Examples include methyl alcohol, ethyl alcohol, n-propyl alcohol, n-butyl alcohol, n-pentyl alcohol, n-hexyl alcohol, isopropyl alcohol, isobutyl alcohol, sec-butyl alcohol, tert-butyl alcohol, isopentyl alcohol, amyl alcohol, tert-pentyl alcohol, cyclopentanol, cyclohexanol, allyl alcohol, crotyl alcohol, methyl vinyl carbinol, etc. Isopropyl alcohol is preferred.

The invention provides for dielectric pastes comprising a binder or vehicle with glass or ceramic particulate solids (A), (B) and (C) and/or (D), and optionally components (E) and/or (F), dispersed in said binder or vehicle. The binder or vehicle can be water or water-based or it can be organic; it is preferably organic. The binder or vehicle is provided in an amount sufficient to disperse the solids in the binder or vehicle. The solid components are preferably present in the range of about 60% to about 80% by weight, more preferably about 60% to about 70% by weight of the inventive dielectric paste compositions, and the binder or vehicle is preferably present in the range of about 20% to about 40% by weight, more preferably about 30% to about 40% by weight of such dielectric paste composition.

The organic binder or vehicle is preferably an organic resin dissolved in a suitable solvent. Any essentially inert binder or vehicle can be used in the practice of the present invention, including various organic liquids, with or without thickening and/or stabilizing agents and/or other common additives. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil, the monobutyl ether of ethylene glycol monoacetate, and carbitol. The binder can contain volatile liquids to promote fast setting after application to the substrate.

In one embodiment of the invention, the vehicle or binder contains from about 65% to about 90% by weight of at least one solvent, about 4% to about 10% by weight of at least one resin, up to about 30% by weight of at least one plasticizer, up to about 10% by weight of at least one thixotropic agent, and up to about 10% by weight of at least one surfactant or dispersant.

In another embodiment of the invention, the vehicle or binder contains from about 0.1% to about 20% by weight resin, more preferably about 0.1% to about 10% by weight resin, and about 80% to about 99.9% by weight, more preferably about 90% to about 99.9% by weight, solvent or mixture of solvents. The resin can be ethyl cellulose or an acrylate resin (e.g., methyl methacrylate). The solvent can be terpineol, 2,4,4-trimethyl-1,3-pentanediol monoisobutylrate, N-methyl-2-pyrrolidone or mixtures thereof. The vehicle or binder can include thixotropic agents, preferably at concentrations of up to about 10% by weight; and conventional dispersants, preferably at concentrations of up to about 10% by weight.

The inventive thick film dielectric paste composition can be applied to a substrate using techniques well-known to those skilled in the art. An example of such a technique is silk screening wherein the paste is forced through a fine mesh stainless steel screen in a desired pattern. Typically the size of such a screen varies from about 200 to about 325 mesh. Other examples include spraying, dipping, spinning, brushing and application using a doctor blade.

The invention also relates to dielectric tapes or "green tapes" comprising a flexible substrate and the inventive dielectric composition adhered to the flexible substrate. These tapes are made by casting a dispersion of the inventive dielectric composition in a binder or vehicle onto a flexible substrate, such as a steel belt or polymeric film, and then heating the cast layer to remove the volatile solvent. The binder or vehicle can be the same as described above for use in making dielectric pastes. However, in this embodiment of the invention, the solvent preferably has a boiling point below about 150° C. and the heating step used to remove the solvent is conducted at a sufficient temperature to vaporize the solvent. Examples of such solvents include acetone, xylene, methanol, ethanol, isopropanol, methyl ethyl ketone, 1,1,1-trichlorethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

The dielectric tape can be used as a dielectric or insulating material for multilayer electronic circuits. A roll of dielectric tape is blanked with registration holes in each corner to a size somewhat larger than the actual dimensions of the circuit. To connect various layers of the multilayer circuit, via holes are formed in the dielectric tape. This is typically done by mechanical punching. However, a sharply focused laser can be used to volatilize the dielectric tape. Typical via hole sizes range from about 0.006 to about 0.25 inch. The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing can be carried out in a standard thick film conveyor belt furnace.

The inventive dielectric pastes and dielectric tapes are preferably fired in an oxidizing atmosphere at a peak temperature preferably in the range of about 750° C. to about 1150° C., more preferably about 800° C. to about 950° C., more preferably about 825° C. to about 875° C. Preferably, firing at the peak temperature is maintained for about one minute to about one hour, more preferably about 2 to about 45 minutes, more preferably about 5 to about 40 minutes, more preferably about 5 to about 20 minutes, more preferably about 8 to about 15 minutes. The heat-up rate is preferably about 20° C. to about 90° C. per minute, more preferably about 30° C. to about 80° C. per minute. The cool-down rate is preferably about 20° C. to about 90° C. per minute, more preferably about 30° C. to about 80° C. per minute. The oxidizing atmosphere preferably comprises about 10% to about 100% by volume oxygen, more preferably about 10% to about 50% by volume oxygen, more preferably about 15% to about 25% by volume oxygen; the balence being an inert gas such as nitrogen, helium or argon. Air is a preferred oxidizing atmosphere. The pressure in the firing zone is preferably in the range of about 0.1 to about 5 atmospheres, more preferably about 0.5 to about 2 atmospheres, and advantageously the pressure is atmospheric pressure. The term "firing" is used herein to mean heating to a temperature and for a time sufficient to volatilize (burnout) all of the water or organic material in the dielectric paste or dielectric tape and to sinter the glass or ceramic materials (A), (B) and (C) and/or (D).

The fired inventive dielectric composition preferably has a dielectric constant (k) of up to about 5, more preferably about 2 to about 5, more preferably about 2 to about 4.5; an insulation resistance (IR) of preferably greater than about $10^{11}$ ohms, more preferably greater than about $10^{12}$ ohms and typically in the range of about $10^{11}$ to about $10^{13}$ ohms; a dissipation factor (Tan delta) of preferably about 0.02% to about 0.6%, more preferably about 0.05% to about 0.5%; and a breakdown voltage (BDV) in the range of about 200 to about 2200 volts per mil. Dielectric layers applied to substrates and fired in accordance with the invention preferably have thicknesses in the range of about 40 to about 100 micrometers, more preferably about 45 to about 70 micrometers.

The fired inventive dielectric composition preferably has a porosity in the range of about 2% to about 50% by volume open space, more preferably about 10% to about 50%, more preferably about 20% to about 50%, more preferably about 25% to about 45% by volume open space. The average diameter of the pore spaces preferably ranges from about 1 to about 30 micrometers, more preferably about 5 to about 30 micrometers. Porosity is measured using a photomicrograph of a cross-section taken at random of the fired inventive dielectric composition at a magnification factor in the range of 500X to 1000X. A clear planar square grid is used that is 4 cm in length on a side, and contains five horizontal parallel lines each spaced 1 cm apart and five vertical parallel lines each spaced 1 cm apart, the horizontal and vertical lines having a total of 25 equally spaced points of intersection. The grid is randomly placed over the photomicrograph and the number of grid points overlying pores is counted. A grid point landing on a line dividing a pore and a dense mass is counted as a one-half grid point. The procedure is performed three times for each photomicrograph, the grid being placed in a different random location each time, and the average number of grid points is determined for the three measurements. The porosity is calculated by dividing the average number of grid points overlying pores by the total number of grid points (25). The average diameter of the pore spaces is calculated from measurements of the pore diameters taken from these photomicrographs.

In order to illustrate the invention the following examples are provided. Unless otherwise indicated, in the following examples as well as throughout the entire specification and in the appended claims, all parts and percentages are by weight, and all temperatures are in degrees centigrade. In the following examples, all pressures are atmospheric.

With each example, the glass or ceramic powders (A)–(C) of the invention are milled using a 1450 ml alumina lined mill. The solids grinding medium consists of sintered alumina cylinders with diameters of 0.5-inch and lengths of 0.5 inch. 254 ml of isopropyl alcohol or water is used as the liquid grinding medium. The glass or ceramic material charge to the mill is 8.5% by volume of the mill volume. Each glass or ceramic material is milled at a rate of 55 rpm until the desired particle size is achieved. The glass or ceramic powder-liquid medium slurries are removed from the mill and dried at 60° C. The resulting glass or ceramic powders have the compositions indicated in Table I.

TABLE I

| | A-1* | A-2* | A-3* | B-1** | C-1*** |
|---|---|---|---|---|---|
| CaO | 55 | 42 | 47 | — | — |
| $B_2O_3$ | 20 | 26 | 25 | 26 | 13.1 |
| $SiO_2$ | 25 | 32 | 28 | 71 | 37.4 |
| BaO | — | — | — | — | 23.5 |
| $Al_2O_3$ | — | — | — | 1 | 7.6 |
| ZnO | — | — | — | — | 12.2 |
| $ZrO_2$ | — | — | — | — | 1.3 |
| MgO | — | — | — | — | 5 |
| $Na_2O$ | — | — | — | 0.5 | — |
| $K_2O$ | — | — | — | 1 | — |
| $Li_2O$ | — | — | — | 0.5 | — |

*Glass materials A-1, A-2 and A-3 are milled as follows: charge is 332 grams; milling time is 24 hours; liquid medium is water; average particle size of the final product is about 4.9 micrometers.
**Glass material B-1 is milled as follows: charge is 271 grams; milling time is 46 hours; liquid medium is isopropyl alcohol; average particle size of the final product is 3.1 micrometers.
***Glass or ceramic material C-1 is milled as follows: charge is 382 grams; milling time is 52 hours; liquid medium is isopropyl alcohol; average particle size of the final product is 3.3 micrometers.

In Table I, glass powders A-1, A-2 and A-3 correspond to glass (A) of the invention. Glass powder B-1 corresponds to glass (B) of the invention, and glass or ceramic powder C-1 corresponds to glass or ceramic (C) of the invention.

In the following examples, cordierite (J.C.P.D.S. X-Ray card 12-303), which has the formula $$2MgO \cdot 2Al_2O_3 \cdot 5SiO_2$$

and corresponds to glass or ceramic (D) of the invention, is milled using the same procedures as the glass or ceramic materials A-1, A-2, A-3, B-1 and C-1. The charge is 1000 grams. Milling time is 24 hours. The liquid medium is a 1:1 weight ratio mixture of isopropyl alcohol and water. The milling time is 24 hours and the average particle size is 1.2 micrometers.

In order to prepare the inventive dielectric compositions and to test their dielectric properties the formulations identified in Table II are prepared using the glass or ceramic powders identified in Table I, and the milled cordierite referred to above. The glass or ceramic powders A-1, A-2, A-3, B-1 and C-1 along with cordierite, $CaB_2O_4$ and $CrO_2$, in the proportions indicated in Table II, are loaded in a 300 ml alumina lined mill containing 70 ml of isopropyl alcohol and 150 grams of alumina cylinders having diameters of 0.5 inch and lengths of 0.5 inch. The slurries are milled for 30 minutes, transferred to stainless steel pans, and dried in a convection oven at 60° C. overnight. The resulting dry solids mixtures are blended with an organic vehicle or binder to form a paste. The organic vehicle or binder is made from the following ingredients:

| | Pts./Wt. |
|---|---|
| Texanol (product of Eastman Kodak Chemicals identified as 2,4,4-trimethyl-1,3-pentanediol mono-isobutylrate) | 57.21 |
| Alpha-Terpineol (product of Hercules identified as alpha-4-trimethyl-3-cyclohexane-1-methanol) | 7.80 |
| Ethyl Cellulose N-300 (product of Hercules identified as an ethyl cellulose resin) | 0.49 |
| M-Pyrol (product of Jasco Chemical Corp. identified as N-methyl-2-pyrrolidone) | 24.00 |
| Thixatrol ST (product of NL Industries identified as a low molecular weight amide useful as a thixotropic agent) | 7.30 |
| Solsperse 3000 (product of ICI America identified as a dispersant) | 3.20 |

The mixtures of dry powder and organic vehicle or binder are placed in containers. The containers are sealed and placed in paint shakers wherein they are shaken for three minutes. The containers are opened and the contents are transferred to a dispersion mill. The mixtures are passed through the mill four times, the resulting products being in the form of pastes. The pastes contain 32-38% by weight organic vehicle or binder and 68-62% by weight solids.

Composite structures for each example are prepared as follows. A gold conductor paste, Conductrox 3066 (a product of Ferro Corporation identified as a gold conductor paste) is printed on an alumina substrate using a 325 mesh Tyler Standard screen. The thickness of the printed layer is 0.7 mil. The printed layer is allowed to level for 5-10 minutes at room temperature, and is then dried at 100° C. for seven minutes. The dried printed layer is fired at 850° C. in air; the temperature of the printed layer is increased from ambient to 850° C. over a 10-minute period, maintained at 850° C. for 10 minutes, then reduced to ambient over a 10-minute period. A dielectric layer using the pastes described above and the formulations reported in Table II is then printed over the conductor layer using the same printing, levelling, drying and firing procedure used for the conductor layer. Second and third dielectric layers using the same formulation as the first dielectric layer are then printed over the first and second dielectric layers, respectively, the same printing, levelling, drying and firing procedure used for the conductor layer being used. A second conductor layer using the same conductor material as the first conductor layer is then printed over the third dielectric layer using the same printing, levelling, drying and firing procedure as with the first conductor layer. The resulting composite structures have thicknesses of about 55 micrometers.

The dielectric constants (k) and the dissipation factors (Tan delta) are measured using a Model 4192A Hewlett Packard bridge and are reported in Table II. These dielectric constants range from 2.21 to 4.72 indicating significantly lower values than those for most glass-ceramic materials which typically have dielectric constants in the range of about 7-12. These dielectric constants are comparable to those available with commercial polyimide dielectrics which typically exhibit dielectric constants of up to about 4.

The dielectric breakdown voltage is determined by increasing the voltage applied across the thickness of the sample until breakdown occurs. A fluke Model 412B high voltage power supply is used.

The results are reported in Table II. In Table II, all numerical values for concentration levels are in parts by weight.

TABLE II

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| A-1 | 18.02 | 29.3 | 20.1 | 21.9 | 18.4 | 27.4 | 1.44 | — | — | — | 14.3 | — | — | — |
| A-2 | — | — | — | — | — | — | 27.36 | 28.8 | — | — | — | 44.33 | 34.48 | 31.03 |
| A-3 | — | — | — | — | — | — | — | — | 28.8 | 28.7 | — | — | — | — |
| B-1 | 53.68 | 42.4 | 59.9 | 65.3 | 54.7 | 46.17 | 43.2 | 43.2 | 43.2 | 43.2 | 57.5 | 44.33 | 34.48 | 31.03 |
| C-1 | 17.7 | 17.6 | 19.7 | — | 17.03 | 16.40 | 18 | 18 | 18 | 17.9 | 17.9 | 10 | 30 | 27 |
| Cordierite | 10.22 | 10.21 | — | 12.4 | 9.403 | 9.57 | 9.5 | 9.5 | 9.5 | 9.9 | 9.9 | — | — | 10 |
| CaB$_2$O$_4$ | — | — | — | — | — | — | — | — | — | — | — | 0.9 | 0.7 | 0.63 |
| Cr$_2$O$_3$ | 0.36 | 0.50 | 0.40 | 0.40 | 0.44 | 0.4 | 0.5 | 0.5 | 0.5 | 0.3 | 0.4 | 0.44 | 0.34 | 0.31 |
| k | 4.4 | 2.63 | 2.86 | 3.54 | 2.86 | 3.17 | 4.02 | 3.90 | 4.08 | 4.00 | 4.00 | 4.00 | 4.16 | 4.1 |
| Tan delta (%) | 0.18 | 0.11 | 0.22 | 0.31 | 0.16 | 0.16 | — | 0.16 | 0.16 | — | — | 0.09 | 0.21 | 0.09 |
| Breakdown voltage (v/ml) | — | 236 | 751 | 1260 | 1572 | — | — | — | — | — | — | 760 | — | 1758 |

| | 15 | 16 | 17 | 18 | 19 | 20 | 21 | 22 | 23 | 24 | 25 | 26 |
|---|---|---|---|---|---|---|---|---|---|---|---|---|
| A-1 | — | — | — | — | — | — | — | — | — | — | — | 35.46 |
| A-2 | 26.6 | 35.46 | 39.9 | 28.8 | 43.2 | 39.4 | 41.86 | 39.9 | — | — | — | — |
| A-3 | — | — | — | — | — | — | — | — | 35.46 | 21.6 | 28.8 | — |
| B-1 | 26.6 | 35.46 | 39.9 | 43.2 | 28.8 | 39.4 | 41.86 | 39.9 | 35.46 | 50.4 | 43.2 | 35.46 |
| C-1 | 36 | 18 | 9 | 18 | 18 | 15 | 10 | 9 | 18 | 18 | 18 | 18 |
| Cordierite | 10 | 10 | 10 | 10 | 10 | 5 | 5 | 10 | 10 | 10 | 10 | 10 |
| CaB$_2$O$_4$ | 0.54 | 0.72 | 0.80 | — | — | 0.8 | 0.85 | 0.81 | 0.72 | — | — | 0.72 |
| Cr$_2$O$_3$ | 0.26 | 0.36 | 0.40 | — | — | 0.4 | 0.43 | 0.4 | 0.36 | — | — | 0.36 |
| k | 4.24 | 4.00 | 4.03 | 4.72 | 4.20 | 4.4 | 4.25 | 4.2 | 3.2 | 4.11 | 3.58 | 2.21 |
| Tan delta (%) | 0.06 | 0.18 | 0.22 | 0.07 | 0.04 | 0.27 | 0.27 | 0.11 | 0.10 | 0.13 | 0.09 | 0.09 |
| Breakdown voltage (v/ml) | 1458 | 1946 | 2000 | 2096 | 1500 | 1230 | 1495 | — | 1234 | 1693 | 1264 | 424 |

Warpage is determined using the dielectric compositions of Examples 2, 6, 7, 23, 25 and 26, the results being reported in Table III. To prepare the test samples, a layer of the indicated dielectric composition is printed on an alumina-based substrate (96% by weight alumina) and then fired using the procedure and firing conditions indicated above for the preparation of the composites reported in Table II. A second dielectric layer is printed over the first dielectric layer and then fired in the same manner as the first dielectric layer. A third dielectric layer is printed over the second dielectric layer and then fired in the same manner as the first dielectric layer. The composite is then fired again using the same firing procedure and conditions as with the first dielectric layer. The sequence is continued until composites with the number of layers indicated in Table III are obtained. Warpage is determined using a square test pattern and a drop-dial gauge. The readings at the corner and the center are determined and the average of $$\frac{\text{(Reading at Center} - \text{Reading at Corner)}}{\text{Corner to Center Distance}}$$

is reported as warpage in mils/inch. The results are indicated in Table III.

TABLE III

| Example | Warpage (mils/inch) | (No. of Layers) |
| --- | --- | --- |
| 2 | 0 | 12 |
| 6 | 0 | 11 |
| 7 | 0 | 9 |
| 23 | 0 | 9 |
| 25 | 0 | 26 |
| 26 | 0 | 11 |

The above data indicates that the dielectrics tested are acceptable as non-warp dielectrics and thus suitable for complex multilayer applications.

Figure 2:
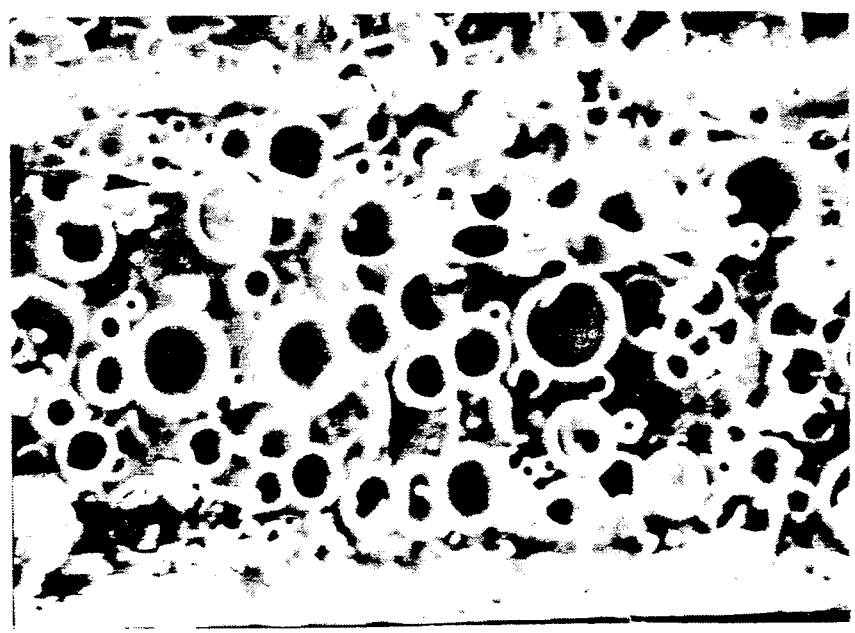
FIG. 2 is a photomicrograph of a cross-section of the composite structure made in accordance with Example 2 using a scanning electron microscope, the voltage being 15 KV and the magnification factor being 830X. The bright dense layers at the top and bottom are gold conductor layers, and the dark porous portion between the conductor layers is the dielectric material.
Figure 3:
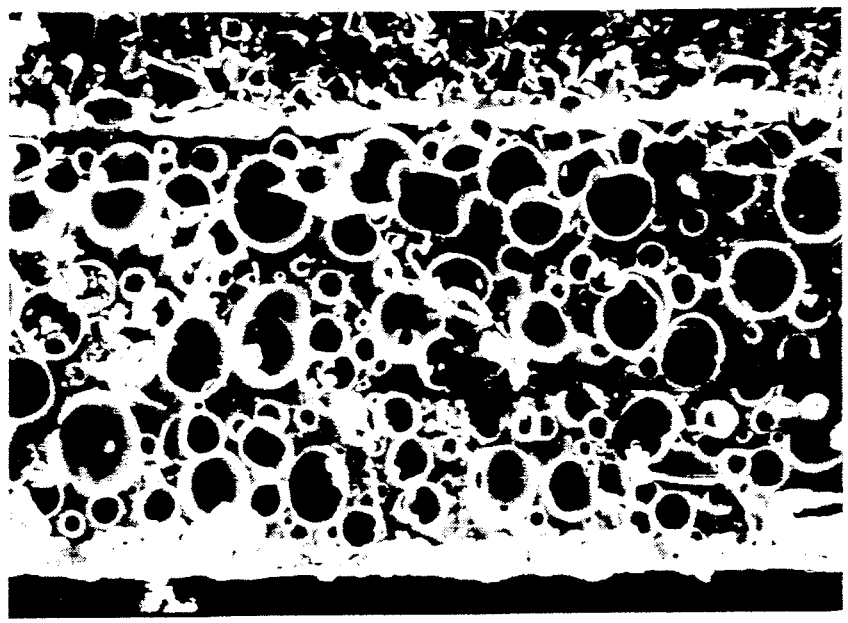
FIG. 3 is a photomicrograph of a cross-section of the composite structure made in accordance with Example 3 using a scanning electron microscope, the voltage being 15 KV and the magnification factor being 560X. The bright dense layers at the top and bottom are gold conductor layers, and the dark porous portion between the conductor layers is the dielectric material.
Figure 4:
FIG. 4 is a photomicrograph of a cross-section of the composite structure made in accordance with Example 4 using a scanning electron microscope, the voltage being 15 KV, the magnification factor being 870X. The bright dense layers at the top and bottom are gold conductor layers, and the dark porous portion between the conductor layers is the dielectric material.

Photomicrographs of cross-sections of the composites made in accordance with Examples 1–4 (Table II) are provided as FIGS. 1–4, respectively. These photomicrographs are used to determine porosity using the following procedure. A clear planar square grid is used that is 4 cm in length on a side, and contains five horizontal parallel lines each spaced 1 cm apart and five vertical parallel lines each spaced 1 cm apart, the horizontal and vertical lines having a total of 25 equally spaced points of intersection. The grid is randomly placed over each photomicrograph and the number of grid points overlying pores is counted. A grid point landing on a line dividing a pore and a dense mass is counted as a one-half grid point. The procedure is performed three times for each photomicrograph, the grid being placed in a different random location each time, and the average number of grid points is determined for the three measurements. The porosity is calculated by dividing the average number of grid points overlying pores by the total number of grid points (25). The porosity of the dielectric materials of the composites made in accordance with Examples 1–4 are as follows:

| Example | Porosity (%) |
| --- | --- |
| 1 | 4.6 |
| 2 | 33 |
| 3 | 35 |
| 4 | 24 |

An advantage of the present invention is that the inventive dielectric compositions have thermal expansion characteristics that match alumina sufficiently so that they can be used in conjunction with alumina or alumina-based substrates for making cofired multilayer circuits having alumina or alumina-based substrates. Another advantage is that the inventive dielectric compositions are compatible with noble metals so that silver, gold and palladium as well as copper conductors can be used. Another advantage is that these dielectric compositions can be fired using a typical thick film or dielectric tape firing profile.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed:

1. A porous dielectric composition formed by firing a composition comprising at least one crystallizable glass, at least one noncrystallizable glass, and at least one Group IIA metal silicate; said crystallizable glass, said noncrystallizable glass and said Group IIA metal silicate being present in said composition as separate and distinct components; said crystallizable glass comprising from about 15% to about 80% by weight of said composition; said noncrystallizable glass comprising from about 15% to about 80% by weight of said composition; said Group IIA metal silicate comprising up to about 45% by weight of said composition; the porosity of said porous dielectric composition ranging from about 10% to about 50% by volume open space, the average diameter of the pore spaces in said porous dielectric composition ranging from about 1 to about 30 micrometers.

2. The dielectric composition of claim 1 with a dielectric constant of up to about 5.

3. The dielectric composition of claim 1 with a porosity in the range of about 20% to about 50% by volume open space.

4. The dielectric composition of claim 1 with a porosity in the range of about 25% to about 45% by volume open space.

5. The dielectric composition of claim 1 wherein the average diameter of said pore spaces ranges from about 5 to about 30 micrometers.

6. The dielectric composition of claim 1 with a dissipation factor of less than about 0.5%.

7. The dielectric composition of claim 1 with an insulation resistance in excess of about $10^{11}$ ohms.

8. The dielectric composition of claim 1 wherein said crystallizable glass comprises about 15% to about 40% by weight $SiO_2$, about 11% to about 30% by weight $B_2O_3$, and about 42% to about 64% by weight CaO.

9. The dielectric composition of claim 1 wherein said noncrystallizable glass comprises at least about 60% by weight $SiO_2$, from about 10% to about 35% by weight $B_2O_3$, up to about 10% by weight $Al_2O_3$, and up to about 6% by weight of at least one alkali metal oxide.

10. The dielectric composition of claim 1 wherein said Group IIA metal silicate comprises about 15% to about 40% by weight $SiO_2$, about 20% to about 50% by weight BaO, up to about 20% by weight $B_2O_3$, up to about 35% by weight $Al_2O_3$, up to about 15% by weight ZnO, up to about 2% by weight $ZrO_2$, up to about 2% by weight $TiO_2$, and up to about 6% by weight MgO.

11. The dielectric composition of claim 1 wherein said Group IIA metal silicate comprises about 48% to about 55% by weight $SiO_2$, about 18% to about 40% by weight $Al_2O_3$, about 10% to about 25% by weight MgO, up to about 3% by weight $B_2O_3$, up to about 2% by weight ZnO, up to about 3% by weight $ZrO_2$, up to about 3% by weight $TiO_2$, up to about 1% by weight $Li_2O$, up to about 3% by weight $P_2O_5$, and up to about 3% by weight $SnO_2$.

12. A composition for use in producing a porous dielectric composition having a porosity ranging from about 2% to about 50% by volume open space, said composition comprising:
(A) at least one crystallizable glass comprising from about 15% to about 40% by weight $SiO_2$, from about 11% to about 30% by weight $B_2O_3$, and from about 42% to about 64% by weight CaO;
(B) at least one noncrystallizable glass comprising at least about 60% by weight $SiO_2$, from about 10% to about 35% by weight $B_2O_3$, up to about 10% by weight $Al_2O_3$, and up to about 6% by weight of at least one alkali metal oxide; and
(C) a Group IIA metal silicate;

said noncrystallizable glass, said crystallizable glass and said Group IIA metal silicate being present in said composition as separate and distinct components.

13. The composition of claim 12 wherein the Group IIA metal silicate comprises:
   (D) at least one glass or ceramic material comprising from about 15% to about 40% by weight $SiO_2$, from about 20% to about 50% by weight BaO, up to about 20% by weight $B_2O_3$, up to about 35% by weight $Al_2O_3$, up to about 15% by weight ZnO, up to about 2% by weight $ZrO_2$, up to about 2% by weight $TiO_2$, and up to about 6% by weight MgO; or
   (E) at least one glass or ceramic material comprising from about 48% to about 55% by weight $SiO_2$, from about 18% to about 40% by weight $Al_2O_3$, from about 10% to about 25% by weight MgO, up to about 3% by weight $B_2O_3$, up to about 2% by weight ZnO, up to about 3% by weight $ZrO_2$, up to about 3% by weight $TiO_2$, up to about 1% by weight $Li_2O$, up to about 3% by weight $P_2O_5$, and up to about 3% by weight $SnO_2$.

14. The composition of claim 12 including:
   (F) at least one crystallizing agent; and
   (G) at least one colorant.

15. A process for making a porous dielectric composition having a porosity ranging from about 2% to about 50% by volume open space comprising:
   (I) milling a glass composition in the presence of an alcohol of 1 to about 6 carbon atoms to provide the glass composition with an average particle size in the range of about 2 to about 10 micrometers;
   (II) drying such milled glass composition from (I);
   (III) combining such dried glass composition from (II) with an aqueous or organic vehicle or binder to form a dispersion of such dried glass composition in such vehicle or binder;
   (IV) coating at least part of a substrate with such dispersion from (III); and
   (V) firing such coated substrate from (IV) in the presence of an oxygen source at a peak firing temperature in the range of from about 750° C. to about 1150° C., the temperature of such coated substrate being increased from ambient to such peak firing temperature at a rate of from about 20° C. to about 90° C. per minute, maintaining such coated substrate at such peak firing temperature for about one minute to about one hour, and reducing the temperature of such coated substrate to ambient at a rate of from about 20° C. to about 90° C. per minute;
   such glass composition comprising:
   (A) at least one crystallizable glass comprising about 15% to about 40% by weight $SiO_2$, about 11% to about 30% by weight $B_2O_3$, and about 42% to about 64% by weight CaO;
   (B) at least one noncrystallizable glass comprising at least about 60% by weight $SiO_2$, from about 10% to about 35% by weight $B_2O_3$, up to about 10% by weight $Al_2O_3$, and up to about 6% by weight of at least one alkali metal oxide; and
   (C) at least one Group IIA metal silicate;
   such crystallizable glass, such noncrystallizable glass and such Group IIA metal silicate being present in such glass composition as separte and distinct components.

16. A process as set forth in claim 15 wherein such Group IIA metal silicate comprises:
   (D) at least one glass or ceramic material comprising about 15% to about 40% by weight $SiO_2$, about 20% to about 50% by weight BaO, up to about 20% by weight $B_2O_3$, up to about 35% by weight $Al_2O_3$, up to about 15% by weight ZnO, up to about 2% by weight $ZrO_2$, up to about 2% by weight $TiO_2$, and up to about 6% by weight MgO; or
   (E) at least one glass or ceramic material comprising about 48% to about 55% by weight $SiO_2$, about 18% to about 40% by weight $Al_2O_3$, about 10% to about 25% by weight MgO, up to about 3% by weight $B_2O_3$, up to about 2% by weight ZnO, up to about 3% by weight $ZrO_2$, up to about 3% by weight $TiO_2$, up to about 1% by weight $Li_2O$, up to about 3% by weight $P_2O_5$, and up to about 3% by weight $SnO_2$.

17. A process as set forth in claim 15 wherein such composition includes:
   (F) at least one crystallizing agent; and
   (G) at least one colorant.

18. The process of claim 15 wherein such alcohol in said step (I) has from about 2 to about 5 carbon atoms.

19. The process of claim 15 wherein such alcohol in said step (I) comprises isopropyl alcohol.

20. The process of claim 15 wherein such milling in said step (I) is continued until an average particle size in the range of about 3 to about 7 micrometers is obtained.

21. The process of claim 15 wherein such peak firing temperature in said step (V) is in the range of about 800° C. to about 950° C.

22. The process of claim 15 wherein such temperature is increased at a rate of about 30° C. to about 80° C. per minute during said step (V).

23. The process of claim 15 wherein such temperature is decreased at a rate of from about 30° C. to about 80° C. per minute during said step (V).

24. The process of claim 15 wherein said step (V) is conducted in the presence of air.

25. The process of claim 15 wherein said step (V) is conducted at an absolute pressure in the range of about 0.1 to about 5 atmospheres.

26. The process of claim 15 wherein said step (V) is conducted at atmospheric pressure.

27. The process of claim 15 wherein such coated substrate is maintained at such peak firing temperature during said step (V) for from about 2 to about 45 minutes.

28. The process of claim 15 wherein such substrate in said step (IV) comprises at least one conductor material.

29. The process of claim 15 wherein such substrate in said step (IV) comprises at least one layer of at least one dielectric material.

30. The process of claim 29 wherein such layer of such dielectric material has the same composition as such glass composition in said step (I).

31. The process of claim 15 wherein such coated substrate in said step (V) comprises a dielectric tape.

32. A dielectric paste for use in forming a porous dielectric composition having a porosity ranging from about 2% to about 50% by volume open space, said paste comprising from about 20to about 40% by weight of water or at least one binder or vehicle, and from about 60% to about 80% by weight of at least one glass composition, said glass composition comprising:
   (A) from about 15% to about 80% by weight of at least one first glass comprising about 15% to about 40% by weight $SiO_2$, about 11% to about 30% by weight $B_2O_3$, and about 42% to about 64% by weight CaO;

(B) from about 15% to about 80% by weight of at least one second glass comprising at least about 60% by weight $SiO_2$, from about 10% to about 35% by weight $B_2O_3$, up to about 10% by weight $Al_2O_3$, and up to about 6% by weight of at least one alkali metal oxide; and (C) at least one Group IIA metal silicate;

said first glass, said second glass and said Group IIA metal silicate being present in said dielectric paste as separate and distinct components.

33. A dielectric paste as set forth in claim 32 wherein the Group IIA metal silicate comprises:

(D) up to about 45% by weight of at least one glass or ceramic material comprising about 15% to about 40% by weight $SiO_2$, about 20% to about 50% by weight BaO, up to about 20% by weight $B_2O_3$, up to about 35% by weight $Al_2O_3$, up to about 15% by weight ZnO, up to about 2% by weight $ZrO_2$, up to about 2% by weight $TiO_2$, and up to about 6% by weight MgO; or (E) up to about 40% by weight of at least one glass or ceramic material comprising about 48% to about 55% by weight $SiO_2$, about 18% to about 40% by weight $Al_2O_3$, about 10% to about 25% by weight MgO, up to about 3% by weight $B_2O_3$, up to about 2% by weight ZnO, up to about 3% by weight $ZrO_2$, up to about 3% by weight $TiO_2$, up to about 1% by weight $Li_2O$, up to about 3% by weight $P_2O_5$, and up to about 3% by weight $SnO_2$;

with the proviso that the total concentration level of (D) and (E) is up to about 45% by weight of said dielectric paste.

34. A dielectric paste as set forth in claim 32 further comprising:

(F) up to about 5% by weight of at least one colorant; and (G) up to about 5% by weight of at least one colorant.

35. A dielectric tape for producing a porous dielectric composition having a porosity ranging from about 2% to about 50% by volume open space, said dielectric tape comprising a flexible substrate and a composition adhered to said substrate, said composition comprising:

(A) at least one glass comprising from about 15% to about 40% by weight $SiO_2$, from about 11% to about 30% by weight $B_2O_3$, and from about 42% to about 64% by weight CaO;

(B) from about 15% to about 80% by weight of at least one glass comprising at least about 60% by weight $SiO_2$, from about 10% to about 35% by weight $B_2O_3$, up to about 10% by weight $Al_2O_3$, and up to about 6% by weight of at least one alkali metal oxide;

(C) up to about 45% by weight of at least one glass or ceramic material comprising about 15% to about 40% by weight $SiO_2$, about 20% to about 50% by weight BaO, up to about 20% by weight $B_2O_3$, up to about 35% by weight $Al_2O_3$, up to about 15% by weight ZnO, up to about 2% by weight $ZrO_2$, up to about 2% by weight $TiO_2$, and up to about 6% by weight MgO;

(D) up to about 40% by weight of at least one glass or ceramic material comprising about 48% to about 55% by weight $SiO_2$, about 18% to about 40% by weight by weight $Al_2O_3$, about 10% to about 25% by weight MgO, up to about 3% by weight $B_2O_3$, up to about 2% by weight ZnO, up to about 3% by weight $ZrO_2$, up to about 3% by weight $TiO_2$, up to about 1% by weight $Li_2O$, up to about 3% by weight $P_2O_5$, and up to about 3% by weight $SnO_2$;

with the proviso that at least one of (C) or (D) must be present and the total concentration level of (C) and (D) is up to about 45% by weight; and (E) up to about 5% by weight of at least one crystallizing agent;

said glass (A), said glass (B), and said material (C) and said material (D) if present, being present in said composition as separate and distinct components.

36. A multilayered circuit comprising a plurality of layers of interconnected electronic circuitry, each of said layers being separated by a dielectric material, said dielectric material comprising said porous dielectric composition of claim 1.

37. A thick-filmed circuit comprising at least one layer of electronic circuitry in contact with a dielectric material, said dielectric material comprising said porous dielectric composition of claim 1.

* * * * *